(12) United States Patent
Ryu

(10) Patent No.: US 12,446,188 B2
(45) Date of Patent: Oct. 14, 2025

(54) COOLING APPARATUS FOR SUPERCONDUCTING FAULT CURRENT LIMITER

(71) Applicant: LS ELECTRIC CO., LTD., Anyang-si (KR)

(72) Inventor: Ki Nam Ryu, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 157 days.

(21) Appl. No.: 18/281,914

(22) PCT Filed: Feb. 14, 2022

(86) PCT No.: PCT/KR2022/002147
§ 371 (c)(1),
(2) Date: Sep. 13, 2023

(87) PCT Pub. No.: WO2022/196949
PCT Pub. Date: Sep. 22, 2022

(65) Prior Publication Data
US 2024/0164058 A1    May 16, 2024

(30) Foreign Application Priority Data
Mar. 19, 2021    (KR) .................. 10-2021-0035772

(51) Int. Cl.
*H05K 7/20* (2006.01)
*H02H 9/02* (2006.01)

(52) U.S. Cl.
CPC ............ *H05K 7/203* (2013.01); *H02H 9/023* (2013.01); *H05K 7/20309* (2013.01); *H05K 7/20318* (2013.01); *H05K 7/20381* (2013.01)

(58) Field of Classification Search
CPC ............... H05K 7/203; H05K 7/20309; H05K 7/20318; H05K 7/20381; H05K 7/20236;
(Continued)

(56) References Cited

U.S. PATENT DOCUMENTS

| | | | |
|---|---|---|---|
| 2003/0154734 A1* | 8/2003 | Paul ........................ | H01F 6/04 62/50.2 |
| 2005/0028537 A1* | 2/2005 | Yuan ........................ | F17C 1/00 62/51.1 |

(Continued)

FOREIGN PATENT DOCUMENTS

| | | | | |
|---|---|---|---|---|
| CN | 105378861 B | * | 9/2017 | ............... H01F 6/04 |
| CN | 110858509 A | | 3/2020 | |

(Continued)

OTHER PUBLICATIONS

International Search Report for related International Application No. PCT/KR2022/002147; action dated Sep. 22, 2022; (2 pages).
(Continued)

*Primary Examiner* — Sreeya Sreevatsa
(74) *Attorney, Agent, or Firm* — K&L Gates LLP

(57) ABSTRACT

The present disclosure relates to a cooling apparatus for a superconducting fault current limiter, and may comprise a first container for accommodating a super-cooled liquid coolant into which a superconducting element is immersed, a second container disposed in contact with an outer surface of the first container to expose a lower side of a lateral surface of the first container, and for accommodating a saturated liquid coolant, and a freezer inserted into the second container to condense the vaporized saturated liquid coolant.

12 Claims, 4 Drawing Sheets

(58) Field of Classification Search
CPC .......... H02H 9/023; H01F 6/04; F25D 16/00; G01L 19/08
USPC ........................................... 361/19
See application file for complete search history.

(56) References Cited

U.S. PATENT DOCUMENTS

2007/0204632 A1* 9/2007 Lee ........................ F25D 3/10
                                                    62/51.1
2017/0284725 A1* 10/2017 Wikus ............... G01R 33/3804

FOREIGN PATENT DOCUMENTS

| JP | 5017640 B2 | 9/2012 | | |
|---|---|---|---|---|
| JP | 2012217334 A | * | 11/2012 | |
| JP | 2017537296 A | | 12/2017 | |
| KR | 20080102157 A | | 11/2008 | |
| KR | 101104234 B1 | | 1/2012 | |
| KR | 20190142822 A | | 12/2019 | |
| KR | 20220130924 A | | 9/2022 | |
| WO | WO-2015060536 A1 | * | 4/2015 | ............... H01F 6/04 |

OTHER PUBLICATIONS

Written Opinion for related International Application No. PCT/KR2022/002147; action dated Sep. 22, 2022; (4 pages).
Notice of Allowance for related Korean Application No. 10-2021-0035772; action dated Dec. 18, 2023; (6 pages).

* cited by examiner

COOLING APPARATUS FOR SUPERCONDUCTING FAULT CURRENT LIMITER

CROSS-REFERENCE TO RELATED APPLICATION

This application is a National Stage of International Application No. PCT/KR2022/002147, filed on Feb. 14, 2022, which claims priority to and the benefit of Korean Patent Application No. 10-2021-0035772, filed on Mar. 19, 2021, the disclosure of which is incorporated herein by reference in its entirety.

FIELD

The present disclosure relates to a cooling apparatus for a superconducting fault current limiter, and more particularly, to a cooling apparatus for a non-circulating superconducting fault current limiter.

BACKGROUND

Generally, various power system stabilizers for controlling fault current have been proposed.

Among them, the superconducting current limiter means a device that injects impedance into the power system by using the superconductivity of superconductors to limit the capacity of a breaker to block when a fault current occurs.

The superconductor applied to the superconducting current limiter exhibits zero resistance property at a certain temperature and a certain current or less, and exhibits a high resistance as the superconductivity thereof is destroyed and thus transitioned to a phase-conduction state when an unexpected accident occurs in the power system. Therefore, the fault current may be lowered by changing the resistance property of the superconductor depending on its temperature or current.

For the basic operation of a superconducting current limiter as described above, in normal operation, the superconductor of the superconducting current limiter should be cooled by a cooling apparatus and maintained in a superconducting state. Korean Patent No. 10-1104234 (Publication Date: Jan. 10, 2012; Title of Disclosure: Apparatus and Method for Controlling Internal Temperature of Superconducting Fault Current Limiter), which was registered on Jan. 3, 2012 as a patent, discloses a configuration of cooling a superconducting element-immersed liquid nitrogen with using a freezer and a conduction cooling copper band to maintain its temperature. Since a temperature difference occurs in the copper band itself as the length of the copper band increases, however, the operation temperature of the freezer is only lowered in order to obtain an overall sufficient cooling effect, which increases the power consumption of the freezer.

That is, the performance and efficiency of the freezer decreases as the temperature decreases. For example, the power consumption for lowering absolute temperature from 60 K to 50 K increases by about 20% compared to the power consumption for lowering from 80 K to 70 K.

Also, Korean Laid-open Patent Publication No. 10-2008-0102157 (Title of Disclosure: Multi-Bath Apparatus and Method for Cooling Superconductor; Publication Date: Nov. 24, 2008) describes another configuration of a cooling apparatus for maintaining the temperature of a superconducting element.

In the above laid-open patent publication, the cooling apparatus comprises a cooling bath for cooling the superconductor and a shield bath surrounding the cooling bath, in which its pressure is controlled to overcool the cooling bath and to maintain the shield bath in a saturation state.

The freezer is positioned at an inner upper portion of the shield bath. The freezer is not contacted with liquid nitrogen in the shield bath and, the freezer is responsible for re-liquefying the saturated liquid nitrogen from its gas phase-changed state. In addition, in the above laid-open patent publication, the cooling apparatus comprises a configuration in which a cryogenic storage tank is separately provided and the liquid nitrogen is supplied to the shield bath to compensate for a liquid level of the shield bath.

The prior art having such above configurations has a problem in that a spatial and cost loss occurs due to operation of the cryogenic storage tank for storing liquid nitrogen.

SUMMARY

In order to solve the above problems, the present disclosure provides a cooling apparatus for a superconducting fault current limiter which can be operated without any additional supplementation of liquid coolant from an external source.

Further, another object of the present disclosure is to provide a cooling apparatus for a superconducting cold flower capable of securing the cooling temperature uniformity of a superconducting element by activating the circulation of a super-cooled liquid coolant to secure the temperature uniformity.

In addition, another object of the present disclosure is to provide a cooling apparatus for a superconducting current limiter that is highly advantageous for maintaining pressure in a first container in which a super-cooled liquid coolant is accommodated.

Another object of the present disclosure is to provide a cooling apparatus for a superconducting fault current limiter that can improve a temperature estimation method to ensure more full maintenance of air tightness, and to reduce cost and ease of maintenance and repair.

In order to solve the above-mentioned technical problems, the cooling apparatus for the superconducting fault current limiter according to the present disclosure may comprise: a first container for accommodating a super-cooled liquid coolant into which a superconducting element is immersed; a second container positioned in contact with an outer surface of the first container to expose lower parts of a lateral surface of the first container, and for accommodating a saturated liquid coolant; and freezers for condensing the saturated liquid coolant which is inserted into the second container to be vaporized.

In an embodiment of the present disclosure, the liquid level of the super-cooled liquid coolant may be a height at which the superconducting element is completely immersed, and the liquid level of the saturated liquid coolant may be the same as the liquid level of the super-cooled liquid coolant.

In an embodiment of the present disclosure, the liquid level of the super-cooled liquid coolant may be a height at which the superconducting element is completely immersed, and the liquid level of the saturated liquid coolant may be higher than the liquid level of the super-cooled liquid coolant.

In an embodiment of the present disclosure, a lateral surface region of the first container corresponding to a difference between the liquid level of the saturated liquid coolant and the liquid level of the super-cooled liquid coolant may be condensed again when the super-cooled liquid coolant is vaporized, thereby maintaining an internal pressure of the first container.

In an embodiment of the present disclosure, a height of the condensed surface may be 5 to 30 cm.

In an embodiment of the present disclosure, the super-cooled liquid coolant of the first container may be cooled by heat exchange with its upper layer portion, which is a portion adjacent to the saturated liquid coolant of the second container, with a lateral surface of the first container interposed therebetween, and a convection may be formed with the lower layer portion to maintain a uniform temperature throughout.

In an embodiment of the present disclosure, the cooling apparatus may further comprise a pressure sensor for detecting an internal pressure of the second container, and the internal pressure of the second container detected by the pressure sensor may be calculated into a temperature of the saturated liquid coolant, and the calculated temperature of the saturated liquid coolant may be controlled by at least the freezer.

In an embodiment of the present disclosure, the cooling apparatus may further comprise a third container for covering the lateral surface and the bottom surface of the first container and the second container, and for providing a thermal insulation by a vacuum.

The cooling apparatus according to the present disclosure comprises a first container for accommodating a super-cooled liquid coolant, and a second container surrounding an outside of the first container and for accommodating a saturated liquid coolant, wherein the second container is positioned in contact with only the upper side of the first container, thereby activating circulation of the super-cooled liquid coolant by its partial temperature difference, whereby the present disclosure can achieve an effect of securing temperature uniformity of a superconducting element.

In addition, the present disclosure results in an effect of maintaining a pressure inside the first container by operating a wall surface of the first container as a condensed surface by way of setting a liquid level of the saturated liquid coolant in the second container to be higher than that of the super-cooled liquid coolant in the first container.

In addition, the present disclosure has an effect of minimizing the use of a temperature sensor capable of detecting a cryogenic temperature by detecting an internal pressure of the first container and converting the detected pressure into a temperature, thereby reducing a cost, and also has an effect of simplifying a complicated configuration for insertion and sealing of the temperature sensor, which is advantageous in maintenance and improving a pressure maintenance performance.

DETAILED DESCRIPTION

To fully understand the constitution and effects of the present disclosure, the preferred embodiments of the present disclosure will be described with reference to the accompanying drawings. However, the present disclosure is not limited to the embodiments disclosed below, and may be implemented in various ways and various modifications may be added thereto. The description on the embodiments of the present disclosure is provided merely to make the disclosure of the present disclosure complete, and to fully inform a person skilled in the art of the present disclosure. In the accompanying drawings, constitutive elements are shown to enlarge their size than the actual size for convenience of description, and the ratio of each constitutive elements may be exaggerated or reduced.

As used herein, terms such as 'first', 'second', etc., may be used to describe various components, but the components should not be limited by the above terms. The above terms may be used only to distinguish one component from another. For example, 'first component' may be referred to as 'second component', and similarly, 'second component' may be referred to as 'first component' without departing from the scope of the present disclosure. In addition, singular expressions may include plural expressions unless the context clearly dictates otherwise. The terms used in the embodiments of the present disclosure may be interpreted as a meaning commonly known to a person skilled in the art unless otherwise defined.

Hereinafter, a cooling apparatus for a superconducting current limiter according to an embodiment of the present disclosure will be described in detail with reference to the accompanying drawings.

Figure 1:
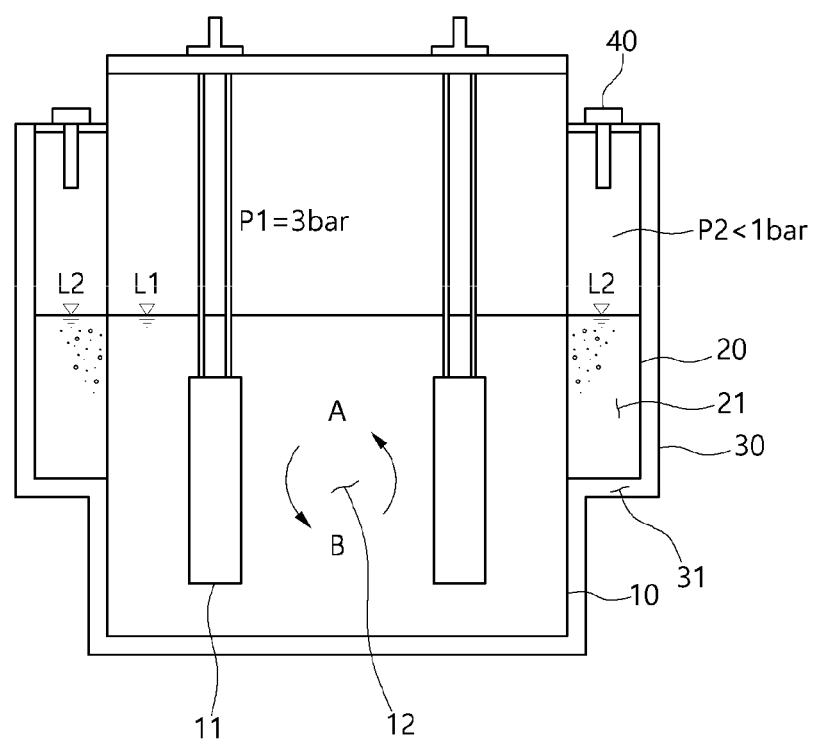
FIG. 1 shows a configuration diagram of a cooling apparatus for a superconducting fault current limiter according to a preferred embodiment of the present disclosure.

FIG. 1 is a cross-sectional configuration diagram of a cooling apparatus for a superconducting current limiter according to a preferred embodiment of the present disclosure.

Referring to FIG. 1, the present disclosure discloses a cooling apparatus for a superconducting fault current limiter comprising: a first container 10 for accommodating a super-cooled liquid coolant 12 into which a superconducting element 11 is immersed; a second container 20 positioned in contact with an outer surface of the first container 10 to expose a lower part of a lateral surface of the first container 10, and for accommodating a saturated liquid coolant 21; a third container 30 positioned in contact with the first container 10, and a lateral surface and a bottom surface of the second container 20; and a freezer for condensing the saturated liquid coolant 21 which is inserted into the second container 20 to be vaporized.

Hereinafter, the superconducting current limiter according to the present disclosure configured as described above will be described in more detail in relation to its configuration and operation.

First, the first container 10 provides a cylindrical accommodation space, and a superconducting element 11 is provided inside. The superconducting element 11 may be prepared in the same number as the number of phases of a power system.

That is, three superconducting elements 11 may be used for a three-phase power system.

The superconducting element 11 is immersed into the super-cooled liquid coolant 12 in the first container 10, and its temperature is maintained by the super-cooled liquid coolant 12 to retain the resistance close to zero in a state before a fault current is generated.

The super-cooled liquid coolant 12 may be liquid nitrogen.

The internal pressure P1 in the first container 10 is 3 bar, and the super-cooled liquid coolant 12 has a temperature of 77 K as a normal reference temperature.

In order to maintain the internal pressure of the first container 10, a non-condensing gas is injected thereinto. Examples of the non-condensed gas include gaseous neon and helium, and the upper side space of the super-cooled liquid coolant 12 of the first container 10 may be understood as maintaining its pressure by filling gas mixed with gaseous neon or helium and gaseous nitrogen.

The super-cooled liquid coolant 12 contained in the first container 10 is not exchanged for another and maintains its temperature in the installation state, unless there is a special reason.

The temperature of the super-cooled liquid coolant 12 in the first container 10 is maintained by the action of the saturated liquid coolant 21 with the freezer 40 in the second container 20.

The second container 20 is located around the lateral surface of the first container 10 but is located only on the upper lateral surface of the first container 10.

The second container 20 may cover about 50% of the height of the lateral surface from the upper end of the lateral surface of the first container 10 downward. More specifically, the second container 20 may cover 40 to 60%.

The pressure P2 of the second container 20 is maintained at less than 1 bar, and the temperature of the saturated liquid coolant 21 needs to be maintained at a temperature of less than 77 K. The saturated liquid coolant 21 may also use liquid nitrogen.

The temperature of the saturated liquid coolant 21 is preferably between 70 and 76 K.

The second container 20 has a ring-type structure for exposing the lower part of the lateral surface of the first container 10 and the bottom surface thereof, and provides an inner space of the same type.

The inner wall of the second container 20 may be advantageous for heat exchange by using a portion of the outer wall of the first container 10 as it is.

The liquid level of the saturated liquid coolant 21 accommodated in the second container 20 may be the same as the liquid level of the super-cooled liquid coolant 12 accommodated in the first container 10, and other examples will be described in more detail below.

A plurality of freezers 40 are coupled to one surface, for example, an upper surface of the second container 20, and cold heads of the freezers 40 are introduced into the second container 20.

Accordingly, heat exchange is performed between the saturated liquid coolant 21 of the second container 20 and the super-cooled liquid coolant 12 of the first container 10, and the heat exchange is performed through a portion of the outer wall of the first container 10 between the saturated liquid coolant 21 and the super-cooled liquid coolant 12.

A portion of the saturated liquid coolant 21 is vaporized by the heat exchange, and the super-cooled liquid coolant 12 maintains its temperature.

The vaporized saturated liquid coolant 21 is condensed by the freezer 40 again to be liquefied, and the liquefied liquid falls by gravity to repeat to be mixed with the saturated liquid coolant 21.

The super-cooled liquid coolant 12 of the first container 10 mainly generates heat exchange at the upper side covered by the second container 20. In FIG. 1, region A is an upper layer region in which heat exchange is performed with the saturated liquid coolant 21 of the second container 20, and the lower layer region B does not generate heat exchange.

However, the temperature of the super-cooled coolant 12 in the lower layer region B is relatively higher than that of the super-cooled liquid coolant 12 in the upper layer region A, and thus a convection occurs between the upper layer region A and the lower layer region B.

That is, the present disclosure restricts the contact surface of the second container 20 and the first container 10 to its portion, and induces a partial thermal imbalance in the super-cooled liquid coolant 12 in the first container 10 according to the heat exchange, thereby forming convection.

The formation of such convection causes the super-cooled liquid coolant 12 in the first container 10 to circulate amongst itself to achieve temperature equilibrium, and is thus characterized by increased temperature uniformity.

Such temperature uniformity may allow the superconducting element 11 to be cooled to a uniform temperature as a whole, and resistance uniformity of the superconducting element 11 itself may be also secured by securing the temperature uniformity of the superconducting element 11.

Furthermore, by reducing the volume of the second container 20 compared to the conventional method, the using amount of saturated liquid coolant 21 is reduced, and maintaining the temperature of the saturated liquid coolant 21 is advantageous because the freezer 40 is utilized to maintain the temperature of a relatively small amount of the saturated liquid coolant 21.

That is, the number of freezers 40 may be reduced or the temperature of the freezers 40 may be controlled to a relatively higher temperature, thereby reducing costs and reducing energy consumption.

The third container 30 has a structure enclosing both the lateral surface and the bottom surface of the second container 20 and the exposed lateral surface and the bottom surface of the first container 10, and the inner side is vacuumed 31 to block heat transfer, which is advantageous for maintaining the temperature of the super-cooled liquid coolant 12 and the saturated liquid coolant 21 of the first container 10 and the second container 20.

Figure 2:
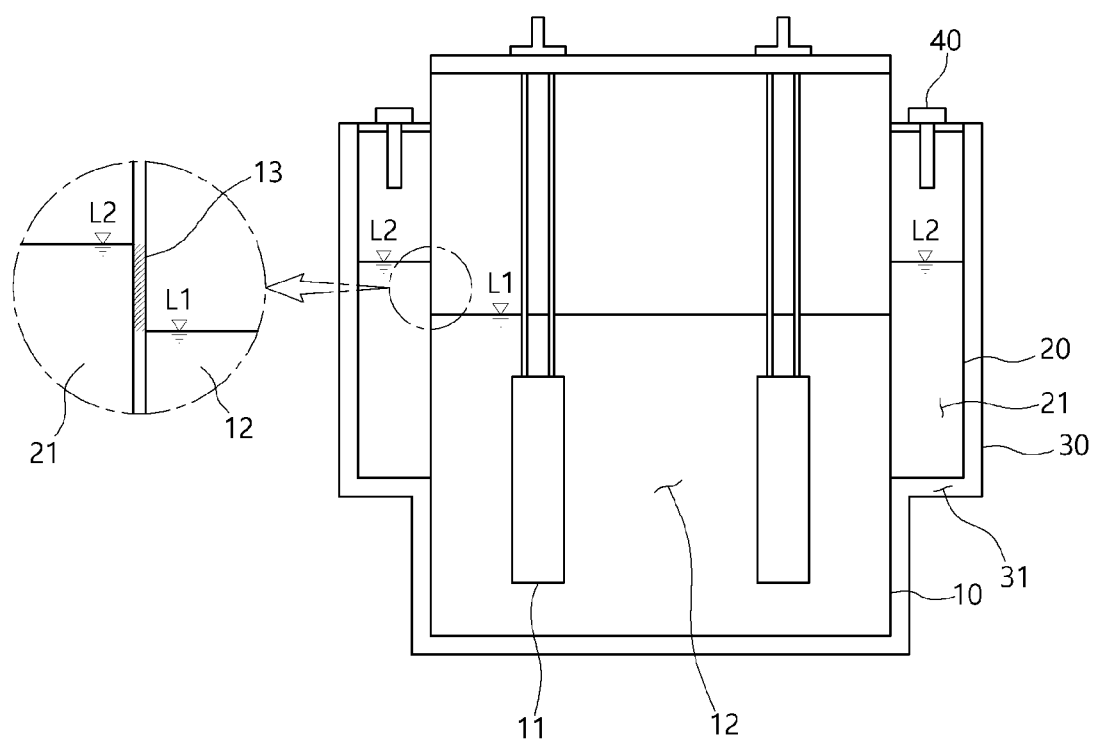
FIGS. 2 to 4 show configuration diagrams of a cooling apparatus for a superconducting fault current limiter according to another embodiment of the present disclosure.

FIG. 2 is a cross-sectional configuration view of a cooling apparatus of a superconducting current restrictor according to another embodiment of the present disclosure.

The configuration of the superconducting current restrictor shown in FIG. 2 according to another embodiment of the present disclosure comprises the first container 10, the second container 20 positioned around a portion of the outer side of the first container 10, and the third container 30 enclosing the lateral surface and the bottom surface of the first container 10 and the second container 20 in the same manner as the example described with reference to FIG. 1.

The superconducting element 11 is accommodated in the inner accommodation space of the first container 10, and the superconducting element 11 is completely submerged in the super-cooled liquid coolant 12.

That is, the liquid level of the super-cooled liquid coolant 12 is positioned higher than that of the superconducting element 11.

As described above, it is suitable that the temperature of the super-cooled liquid coolant 12 is about 77 K, and the space of the first container 10 at the upper side of the super-cooled liquid coolant 12 is injected with a non-condensing gas to maintain the pressure of 3 bar.

The temperature of the super-cooled liquid coolant 12 is maintained at 77 K, and when the pressure is 3 bar, the super-cooled liquid coolant 12 is not vaporized in theory, but the pressure of the first container 10 may be increased due to the vaporization of the super-cooled liquid coolant 12 due to variations in temperature or other reasons.

The pressure change in the first container 10 is a factor that changes the phase equilibrium as a whole, and the pressure needs to be maintained constantly.

Accordingly, as shown in FIG. 2, the liquid level L2 of the saturated liquid coolant 21 in the second container 20 is set to be maintained higher than the liquid level L1 of the super-cooled liquid coolant 12 of the first container 10.

A portion of the outer wall of the first container 10 corresponding to the difference L2-L1 between the liquid level L2 of the saturated liquid coolant 21 and the liquid level L1 of the super-cooled liquid coolant 12 becomes a region having a lower temperature than the other outer wall region, and this is referred to as the condensing surface 13.

The height of the condensing surface 13, that is, the difference between the liquid level L2 of the liquid coolant 21 and the liquid level L2 of the super-cooled liquid coolant 12 becomes 5 to 30 cm.

When the height of the condensing surface 13 is less than 5 cm, the condensing effect is low, and when the height of the condensing surface 13 is more than 40 cm, unnecessary energy may be wasted.

Thus, the gaseous nitrogen, which is the super-cooled liquid coolant 21 vaporized in the first container 10, condenses at the condensation surface 13, where the temperature is below the condensation temperature, liquefies again and flows into the super-cooled liquid coolant 21 by gravity.

This process is repeated over and over again, thus allowing the internal pressure of the first container 10 to be maintained by re-condensing the super-cooled liquid coolant 21 that has vaporized for other reasons.

As previously described, the saturated liquid coolant 21 accommodated in the second container 20 is thermally exchanged with the supper-cooled liquid coolant 12 in the first container 10, and the supper-cooled liquid coolant 12 vaporized at the condensation surface 13 is condensed and vaporized at an increased temperature.

The vaporized saturated liquid coolant 21 is condensed by the cold head of the freezer 40, and the temperature of the saturated liquid coolant 21 and the super-cooled liquid coolant 12 can be maintained and the pressure in the first container 10 can be maintained.

Figure 3:
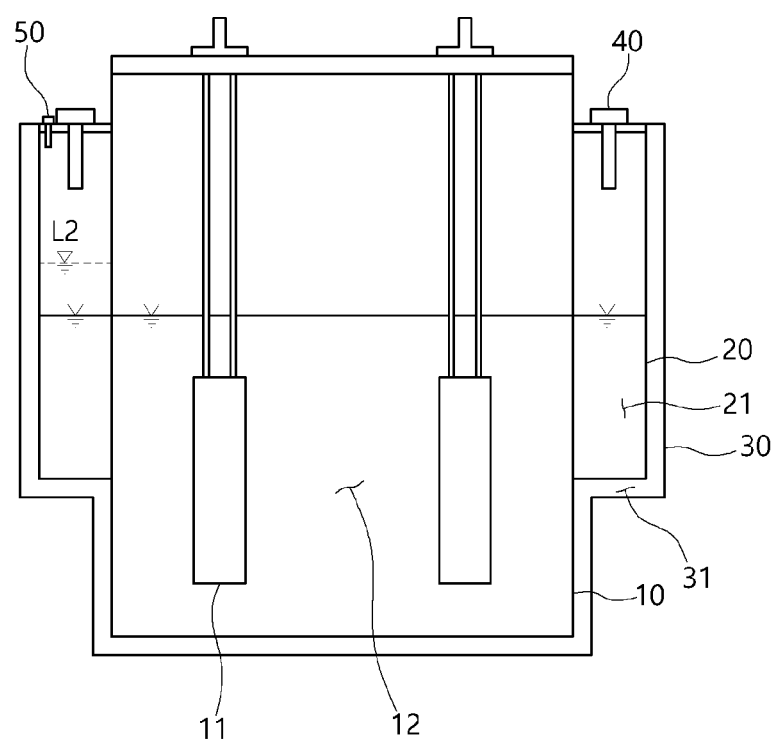

FIG. 3 is a cross-sectional configuration view of a cooling apparatus for a superconducting current limiter according to another embodiment of the present disclosure.

Referring to FIG. 3, the present disclosure may further comprise a pressure sensor 50 for detecting an internal pressure of the second container 20.

In the related art, in order to manage the temperature of the saturated liquid coolant 21 accommodated in the second container 20, a method of detecting the temperature of the saturated liquid coolant 21 using a temperature sensor directly contacting the saturated liquid coolant 21 in the second container 20 has been used.

As described above, the use of temperature sensors that directly detect the temperature of the saturated liquid coolant 21, which is extremely cold, was not only costly, but also very difficult to replace if the temperature sensor failed.

In consideration of this, the present disclosure utilizes a pressure sensor 50 to detect the internal pressure of the second container 20 and converts it to a temperature to obtain an estimate of the temperature of the saturated liquid coolant 21.

Based on the temperature estimate, the temperature of the freezer 40 can be adjusted, and if necessary, the temperature of the saturated liquid coolant 21 can be adjusted using an additional heater.

The temperature of the saturated liquid coolant 21 using the pressure sensor 50 may be estimated using a temperature-pressure graph including a saturation curve of the saturated liquid coolant 21.

If the pressure detected by the pressure sensor 50 is high, it may be determined that the temperature of the saturated liquid coolant 21 is higher than the normal temperature and therefore more has vaporized than is appropriate, and conversely, if the pressure is low, it can be determined that the temperature of the saturated liquid coolant 21 is lower than the normal temperature and therefore more has condensed compared to the amount vaporized.

Thus, the present disclosure may utilize the pressure sensor 50 to estimate the temperature of the saturated liquid coolant 21 and perform temperature control of the saturated liquid coolant 21.

In the present disclosure, the pressure sensor 50 may be used alone and any temperature sensor that directly detects the temperature of the saturated liquid coolant 21 may not be used.

In addition, a redundancy structure for temperature detection may be used by using both the pressure sensor 50 and a temperature sensor for directly detecting the temperature of the saturated liquid coolant 21.

In other words, if the temperature of the saturated liquid coolant 21 detected by the temperature sensor is compared with the temperature of the saturated liquid coolant 21 converted to the pressure detected by the pressure sensor 50, and the difference is greater than or equal to the set value, it can be judged as an abnormality of the temperature sensor.

Figure 4:
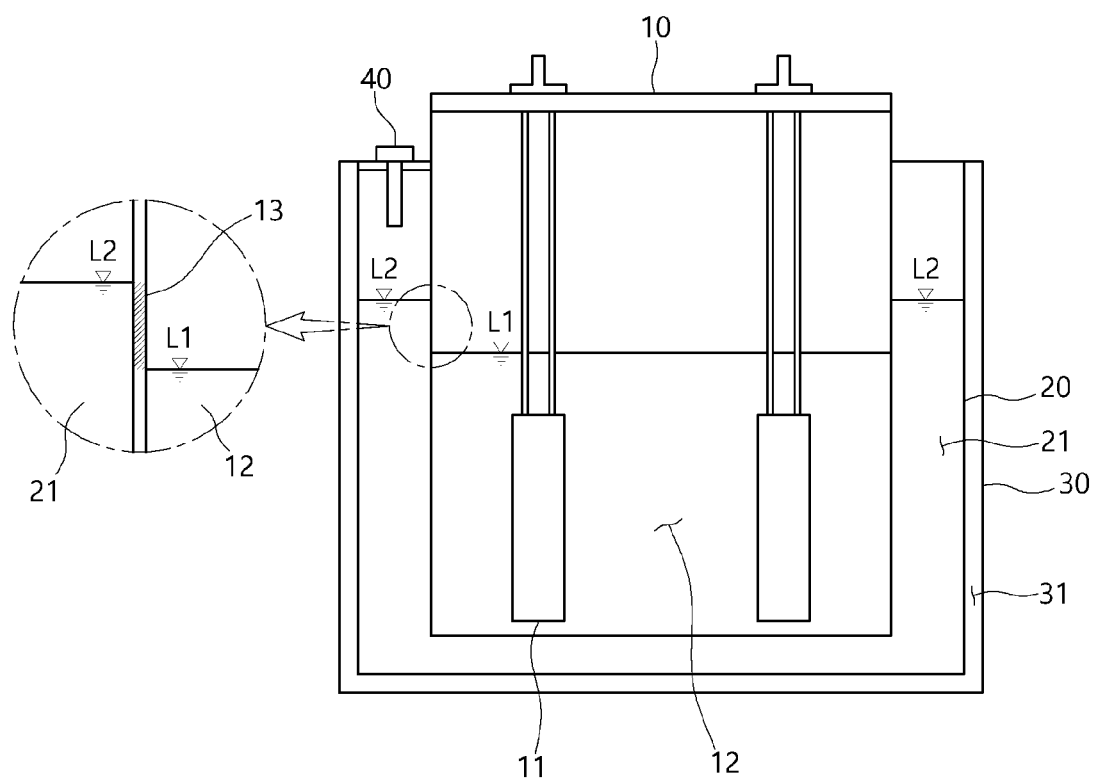

FIG. 4 is a cross-sectional view of the cooling apparatus for the superconducting current limiter according to another embodiment of the present disclosure.

Referring to FIG. 4, the cooling apparatus according to the present disclosure may have a structure in which the second container 20 covers the bottom surface of the first container 10.

The above structure can also be applied to the previously described structure of the condensing surface 13, and temperature detection by applying the pressure sensor 50 is possible.

Although the embodiments of the present disclosure have been described above, they are merely exemplary, and those skilled in the art will understand that various modifications and equivalent embodiments are possible therefrom. Accordingly, the true technical protection scope of the present disclosure should be determined by the following claims.

The present disclosure relates to a technology for maintaining uniformity in temperature inside a container using natural laws and has industrial applicability.

What is claimed is:

1. A cooling apparatus for a superconducting fault current limiter comprising:
   a superconducting element;
   a first container, comprising:
      a first inner surface in which a super-cooled liquid coolant is accommodated at a first liquid level and into which the superconducting element is immersed; and
      a first outer surface;
   a second container comprising:
      a second inner surface in which a saturated liquid coolant is accommodated at a second liquid level and a headspace is defined above the second liquid level into which a vapor of the saturated liquid coolant is accommodated; and
      a second outer surface positioned in contact with the first outer surface of the first container; and
   a freezer inserted into the headspace.

2. The cooling apparatus of claim 1, characterized in that the second container is located only on an upper side of the first container.

3. The cooling apparatus of claim 1, characterized in that: the second liquid level of the saturated liquid coolant is the same as the first liquid level of the super-cooled liquid coolant.

4. The cooling apparatus of claim 1, characterized in that: the second liquid level of the saturated liquid coolant is higher than the first liquid level of the super-cooled liquid coolant while a first pressure of a first vapor of the super-cooled liquid coolant is greater than a second pressure of a second vapor of the saturated liquid coolant.

5. The cooling apparatus of claim 4, characterized in that: a lateral surface region of the first container corresponding to a difference between the first level and the second level includes a condensing surface that re-condenses the super-cooled liquid coolant to maintain an internal pressure of the first container when the super-cooled liquid coolant is vaporized.

6. The cooling apparatus of claim 5, characterized in that the condensing surface has a height of 5 to 30 cm.

7. The cooling apparatus of claim 4, characterized in that: the super-cooled liquid coolant of the first container is cooled by heat exchange with an upper layer portion of the super-cooled liquid coolant that is adjacent to the saturated liquid coolant of the second container, with a lateral surface of the first container interposed therebetween.

8. The cooling apparatus of claim 4, further comprising: a pressure sensor for detecting an internal pressure of the second container,
wherein an internal pressure of the second container detected by the pressure sensor is converted to a temperature of the saturated liquid coolant, and
the converted temperature of the saturated liquid coolant is controlled by at least the freezer.

9. The cooling apparatus of claim 4, further comprising a third container covering a lateral surface and a bottom surface of the first container and a lateral surface and a bottom surface of the second container to provide a thermal insulation by a vacuum.

10. A cooling apparatus for a superconducting fault current limiter comprising:
a first container, accommodating a super-cooled liquid coolant at a first liquid level and defining a first headspace above the first liquid level into which a first vapor of the super-cooled liquid coolant is accommodated at a first pressure;
a superconducting element submerged in the super-cooled liquid coolant below the first liquid level;
a second container, accommodating a saturated liquid coolant at a second liquid level and defining a second headspace above the second liquid level into which a second vapor of the saturated liquid coolant is accommodated at a second pressure, wherein the second level is higher than the first level and wherein the second pressure is less than the first pressure; and
a freezer disposed in the second headspace.

11. The cooling apparatus of claim 4, wherein the first headspace accommodates a filling gas selected from the group consisting of:
Neon; and
Helium.

12. A cooling apparatus for a superconducting fault current limiter comprising:
a first container configured to accommodate a super-cooled liquid coolant into which a superconducting element is immersed;
a second container configured to accommodate a saturated liquid coolant and define a headspace into which a vapor of the saturated liquid coolant is accommodated, the saturated liquid coolant exchanging heat with the super-cooled liquid coolant through a wall between the saturated liquid coolant and the super-cooled liquid coolant; and
a freezer configured to be inserted into the headspace of the second container;
wherein the second container is located such that heat exchange between the saturated liquid coolant and the super-cooled liquid coolant only occurs on an upper side of the super-cooled liquid coolant.

* * * * *